(12) United States Patent
Huang

(10) Patent No.: US 8,891,787 B2
(45) Date of Patent: Nov. 18, 2014

(54) POP NOISE SUPPRESSING CIRCUIT AND ITS METHOD

(75) Inventor: Junwei Huang, Chengdu (CN)

(73) Assignee: IPGoal Microelectronics (SiChuan) Co., Ltd., Chengdu, Sichuan Province (CN)

(*) Notice: Subject to any disclaimer, the term of this patent is extended or adjusted under 35 U.S.C. 154(b) by 298 days.

(21) Appl. No.: 13/454,092

(22) Filed: Apr. 24, 2012

(65) Prior Publication Data

US 2013/0003988 A1  Jan. 3, 2013

(30) Foreign Application Priority Data

Jul. 1, 2011 (CN) .......................... 2011 1 0182734

(51) Int. Cl.
*H03F 3/45* (2006.01)
*H03F 1/30* (2006.01)
*H03F 3/185* (2006.01)

(52) U.S. Cl.
CPC ............ *H03F 1/305* (2013.01); *H03F 3/45192* (2013.01); *H03F 3/185* (2013.01); *H03F 3/45475* (2013.01)
USPC ........................................................ 381/94.5

(58) Field of Classification Search
CPC ........... H03F 1/305; H03F 3/72; H03F 1/308; H03F 2203/7203; H03F 2203/7227; H03F 3/185; H03G 3/348
USPC ........................................................ 381/94.5
See application file for complete search history.

(56) References Cited

U.S. PATENT DOCUMENTS

| | | | |
|---|---|---|---|
| 2007/0030038 A1* | 2/2007 | McHugh et al. .............. | 327/100 |
| 2009/0226007 A1* | 9/2009 | Nagashima ................... | 381/94.5 |
| 2010/0141342 A1* | 6/2010 | Pujol et al. ..................... | 330/261 |

* cited by examiner

*Primary Examiner* — Duc Nguyen
*Assistant Examiner* — George Monikang

(57) ABSTRACT

A POP noise suppressing circuit includes a blocking capacitor, an outputting element connected to the blocking capacitor, a current generating unit, a charging unit connected to the current generating unit, a discharging unit connected to the current generating unit, a switching unit connected to the charging unit and the discharging unit and a power amplifying unit connected between the switching unit and the blocking capacitor. The current generating unit provides two slowly increasing currents respectively to the charging unit and the discharging unit. The switching unit is for switching between the charging unit and the discharging unit. The charging unit forms a charging current. The discharging unit forms a discharging current. The voltage of the blocking capacitor increases smoothly in a process of powering on and decreases smoothly in a process of powering off. A POP noise suppressing method is also provided.

10 Claims, 6 Drawing Sheets

POP NOISE SUPPRESSING CIRCUIT AND ITS METHOD

BACKGROUND OF THE PRESENT INVENTION

1. Field of Invention

The present invention relates to an audio processing circuit and its method, and more particularly to a POP noise suppressing circuit having a simple structure and an ability to suppress POP noise and a method thereof.

2. Description of Related Arts

POP noise is commonly produced in the processes of powering on and powering off an audio system.

In the audio system, a big capacitor usually works as a blocking capacitor when a power amplifier drives a speaker or an earphone. In the process of powering on, the voltage of the capacitor is supposed to increase to a common mode level; in the process of powering off, the voltage of the capacitor is supposed to decrease to zero, so that the speaker or the earphone is impacted in the processes of powering on and off, and the POP noise is produced and then brings discomfort to sensitive ears. Thus, it is necessary to provide a POP noise suppressing circuit and its method to effectively suppress the POP noise.

SUMMARY OF THE PRESENT INVENTION

According to the above description, it is necessary to provide a POP noise suppressing circuit having a simple structure and an ability to suppress POP noise and a method thereof.

The POP noise suppressing circuit, for an audio system, comprises a blocking capacitor, an outputting element connected to the blocking capacitor, a current generating unit, a charging unit connected to the current generating unit, a discharging unit connected to the current generating unit, a switching unit connected to the charging unit and the discharging unit and a power amplifying unit connected to the switching unit and the blocking capacitor. The current generating unit supplies two slowly increasing currents respectively to the charging unit and the discharging unit. The switching unit is for switching between the charging unit and the discharging unit. The charging unit forms a charging current which firstly increases slowly and smoothly and then decreases slowly and smoothly. The discharging unit forms a discharging current which firstly increases slowly and smoothly and then decreases slowly and smoothly. A voltage of the blocking capacitor increases smoothly when the audio system is powered on and smoothly decreases when the audio system is powered off.

The POP noise suppressing method, for an audio system, comprises following steps:

switching off a discharging unit and switching on a charging unit by a switching unit in a process of powering on;

connecting the charging unit to a power amplifying unit having a unity gain structure through the switching unit;

generating a first current which increases slowly and smoothly by a current generating unit, sending the first current to the charging unit, generating a charging current which firstly increases slowly and smoothly and then decreases slowly and smoothly according to the first current by the charging unit, allowing an inputting voltage of the power amplifying unit to increase slowly and smoothly according to the changes of the charging current, outputting a voltage which increases slowly and smoothly by the power amplifying unit and send the voltage to a blocking capacitor; and allowing the voltage of the blocking capacitor to increase slowly and smoothly and outputting a normal audio signal by an outputting element which is connected to the blocking capacitor.

Compared to conventional arts, the present invention allows the voltage of the blocking capacitor to increase slowly and smoothly in the process of powering on and to decrease slowly and smoothly in the process of powering off; the present invention has a simple structure and is able to effectively suppress the POP noise formed in the processes of powering on and powering off in the audio system.

DETAILED DESCRIPTION OF THE PREFERRED EMBODIMENT

Figure 1:
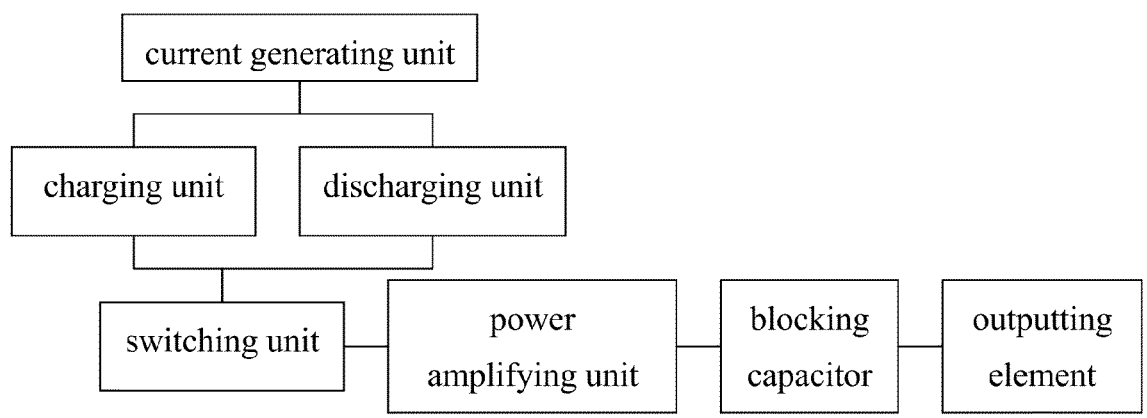
FIG. 1 is a system block diagram of a POP noise suppressing circuit according to a preferred embodiment of the present invention.

Referring to FIG. 1 of the drawings, according to a preferred embodiment of the present invention, a POP noise suppressing circuit comprises a current generating unit, a charging unit connected to the current generating unit, a discharging unit connected to the current generating unit, a switching unit connected to the charging unit and the discharging unit, a power amplifying unit connected to the switching unit, a blocking capacitor CAC connected to the power amplifying unit and an outputting element connected to the blocking capacitor.

Figure 2:
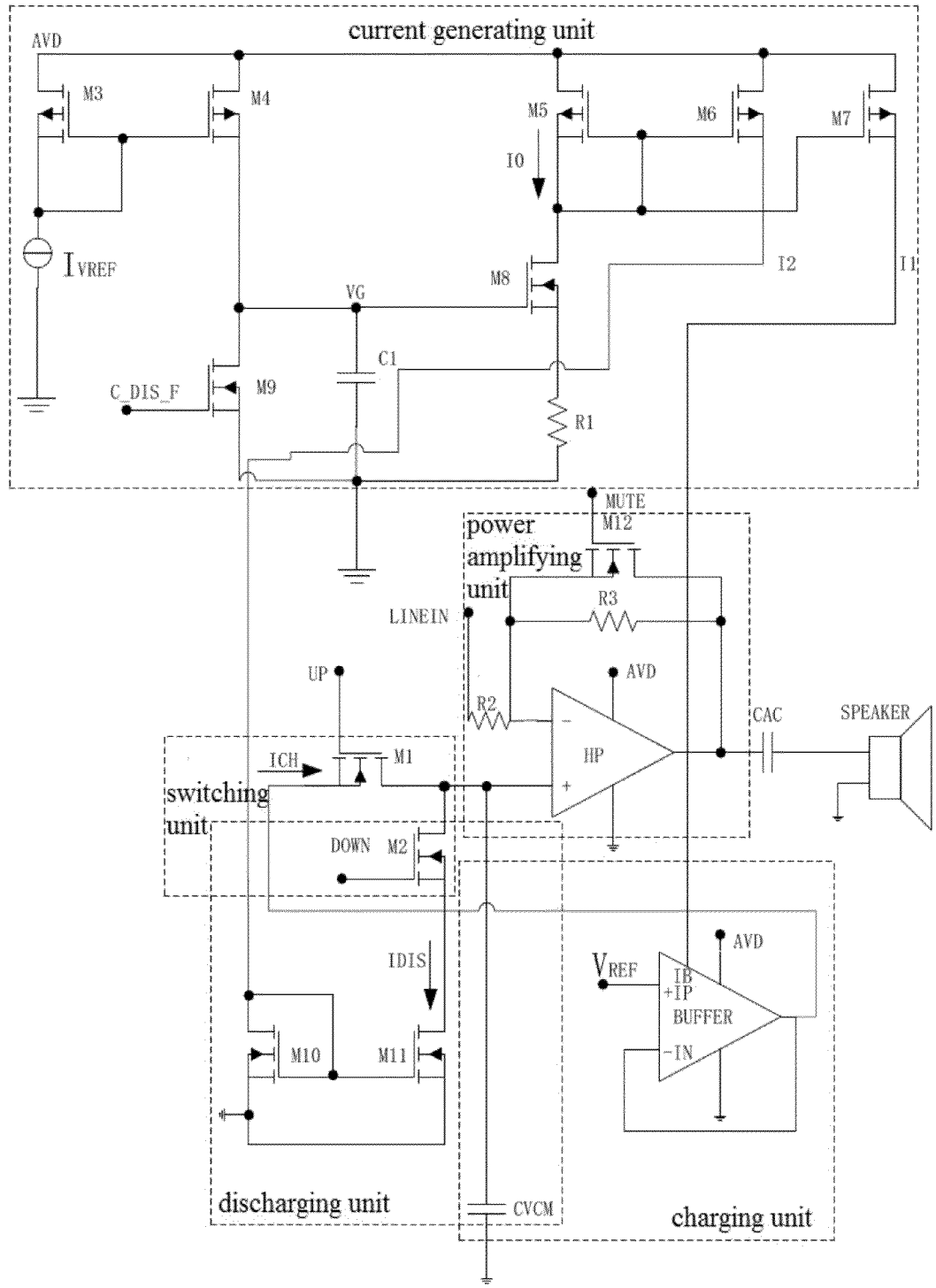
FIG. 2 is a circuit diagram of the POP noise suppressing circuit according to the preferred embodiment of the present invention.

Further referring to FIG. 2, according to the preferred embodiment of the present invention, the switching unit comprises a first field effect transistor (FET) M1 and a second FET M2 and the outputting element is a speaker SPEAKER; the current generating unit comprises a third FET M3, a fourth FET M4, a fifth FET M5, a sixth FET M6, a seventh FET M7, an eighth FET M8, a ninth FET M9, a referential current source $I_{VREF}$, a first resistance R1 and a first capacitor C1. The charging unit comprises an operational amplifier BUFFER and a filtering capacitor CVCM. The discharging unit comprises a tenth FET M10, and an eleventh FET M11. The discharging unit further comprises the second FET M2 and the filtering capacitor CVCM. The power amplifying unit comprises a power amplifier HP, a second resistance R2, a third resistance R3 and a twelfth FET M12.

The current generating unit is for supplying a first current I1 which increases slowly and smoothly to the charging unit and a second current I2 which increases slowly and smoothly to the discharging unit. The charging unit is for charging the filtering capacitor CVCM and forming a charging current ICH which firstly increases slowly and smoothly and then decreases slowly and smoothly. The discharging unit is for discharging the filtering capacitor CVCM and forming a discharging current IDIS which firstly increases slowly and smoothly and then decreases slowly and smoothly. The switching unit is for switching between the charging unit and the discharging unit. The power amplifying unit is for driving the speaker SPEAKER to ensure the speaker SPEAKER to work normally. The blocking capacitor CAC is for isolating direct current signals and only permitting audio signals to pass.

According to the preferred embodiment of the present invention, specific circuit connections of the POP noise suppressing circuit are following. A first terminal of the referential current source $I_{VREF}$ is connected to a gate electrode and a source electrode of the third FET M3 and a gate electrode of the fourth FET M4 in the current generating unit. A second terminal of the referential current source $I_{VREF}$ is connected to earth. A source electrode of the fourth FET M4 is connected to a drain electrode of the ninth FET M9, a gate electrode of the eighth FET M8 and a positive terminal of the first capacitor C1. A drain electrode of the eighth FET M8, a gate electrode and a source electrode of the fifth FET M5, a gate electrode of the sixth FET M6 and a gate electrode of the seventh FET M7 are connected with each other. A source electrode of the eighth FET M8 is connected to a first terminal of the first resistance R1. A gate electrode of the ninth FET M9 is connected to a first voltage terminal C_DIS_F. A source electrode of the ninth FET M9, a negative terminal of the first capacitor C1 and a second terminal of the first resistance R1 are all connected to earth. A drain electrode of the third FET M3, a drain electrode of the fourth FET M4, a drain electrode of the fifth FET M5, a drain electrode of the sixth FET M6 and a drain electrode of the seventh FET M7 are all connected to a source terminal AVD. A source electrode of the seventh FET M7 is connected to a source controlling terminal IB of the operational amplifier BUFFER and outputs the first current I1 to the charging unit. A source electrode of the sixth FET M6 is connected to a gate electrode and a drain electrode of the tenth FET M10 in the discharging unit and outputs the second current I2 to the discharging unit. A non-inverting inputting terminal IP of the operational amplifier BUFFER is connected to a referential voltage terminal $V_{REF}$. An inverting inputting terminal IN of the operational amplifier BUFFER is connected to an outputting terminal OUT of the operational amplifier BUFFER. The outputting terminal OUT of the operational amplifier BUFFER is connected to a source electrode of the first FET M1. A gate electrode of the first FET M1 is connected to a second voltage terminal UP. A drain electrode of the first FET M1, a drain electrode of the second FET M2, a non-inverting inputting terminal of the power amplifier HP and a positive terminal of the filtering capacitor CVCM are all connected with each other. A source electrode of the tenth FET M10, a source electrode of the eleventh FET M11 and a negative terminal of the filtering capacitor CVCM are all connected to earth. A gate electrode of the second FET M2 is connected to a third voltage terminal DOWN. A source electrode of the second FET M2 is connected to a drain electrode of the eleventh FET M11. A first terminal of the second resistance R2 is connected to an audio inputting terminal LINEIN. A gate electrode of the twelfth FET M12 is connected to a mute controlling terminal MUTE. A source electrode of the twelfth FET M12, a first terminal of the third resistance R3 and a second terminal of the second resistance R2 are all connected to an inverting inputting terminal of the power amplifier HP. A drain electrode of the twelfth FET M12, a second terminal of the third resistance R3 and an outputting terminal of the power amplifier HP are all connected to a first terminal of the blocking capacitor CAC. A second terminal of the blocking capacitor CAC is connected to the speaker SPEAKER.

Figure 3:
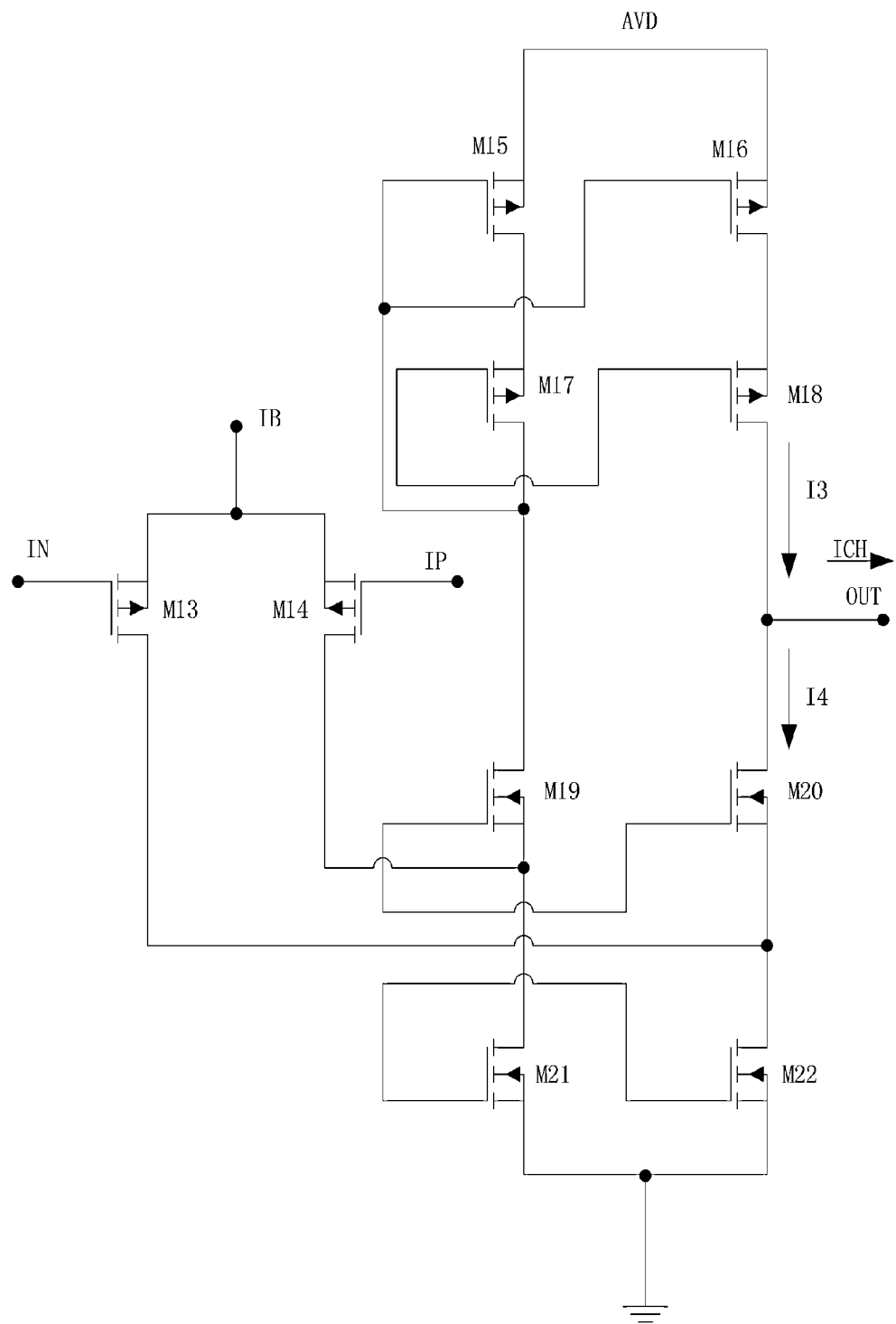
FIG. 3 is a circuit diagram of an operational amplifier of the POP noise suppressing circuit according to the preferred embodiment of the present invention.

According to the preferred embodiment of the present invention, FIG. 3 shows a circuit structure of an inner part of the operational amplifier BUFFER in the charging unit of the POP noise suppressing circuit which comprises a thirteenth FET M13, a fourteenth FET M14, a fifteenth FET M15, a sixteenth FET M16, a seventeenth FET M17, an eighteenth FET M18, a nineteenth FET M19, a twentieth FET M20, a twenty-first FET M21 and a twenty-second FET M22. A gate electrode of the thirteenth FET M13 is connected to the inverting inputting terminal IN. A gate electrode of the fourteenth FET M14 is connected to the non-inverting inputting terminal IP. A source electrode of the thirteenth FET M13 and a source electrode of the fourteenth FET M14 are both connected to the source controlling terminal IB. A drain electrode of the thirteenth FET M13 is connected to a source electrode of the twentieth FET M20 and a drain electrode of the twenty-second FET M22. A drain electrode of the fourteenth FET M14 is connected to a source electrode of the nineteenth FET M19 and a drain electrode of the twenty-first FET M21. A gate electrode of the fifteenth FET M15, a gate electrode of the sixteenth FET M16, a drain electrode of the seventeenth FET M17 and a drain electrode of the nineteenth FET M19 are all connected with each other. A source electrode of the fifteenth FET M15 and a source electrode of the sixteenth FET M16 are both connected to THE source terminal AVD. A drain electrode of the fifteenth FET M15 is connected to a source electrode of the seventeenth FET M17. A drain electrode of sixteenth FET M16 is connected to a source electrode of the eighteenth FET M18. A gate electrode of the seventeenth electrode M17 is connected to a gate electrode of the eighteenth FET M18. A gate electrode of the nineteenth FET M19 is connected to a gate electrode of the twentieth FET M20. A gate electrode of the twenty-first FET M21 is connected to a gate electrode of the twenty-second FET M22. A source electrode of the twenty-first FET M21 and a source electrode of the twenty-second FET M22 are both connected to earth. A drain electrode of the eighteenth FET M18 and a drain electrode of the twentieth FET M20 are both connected to the outputting terminal OUT.

Working principles of the POP noise suppressing circuit are following.

Figure 5:
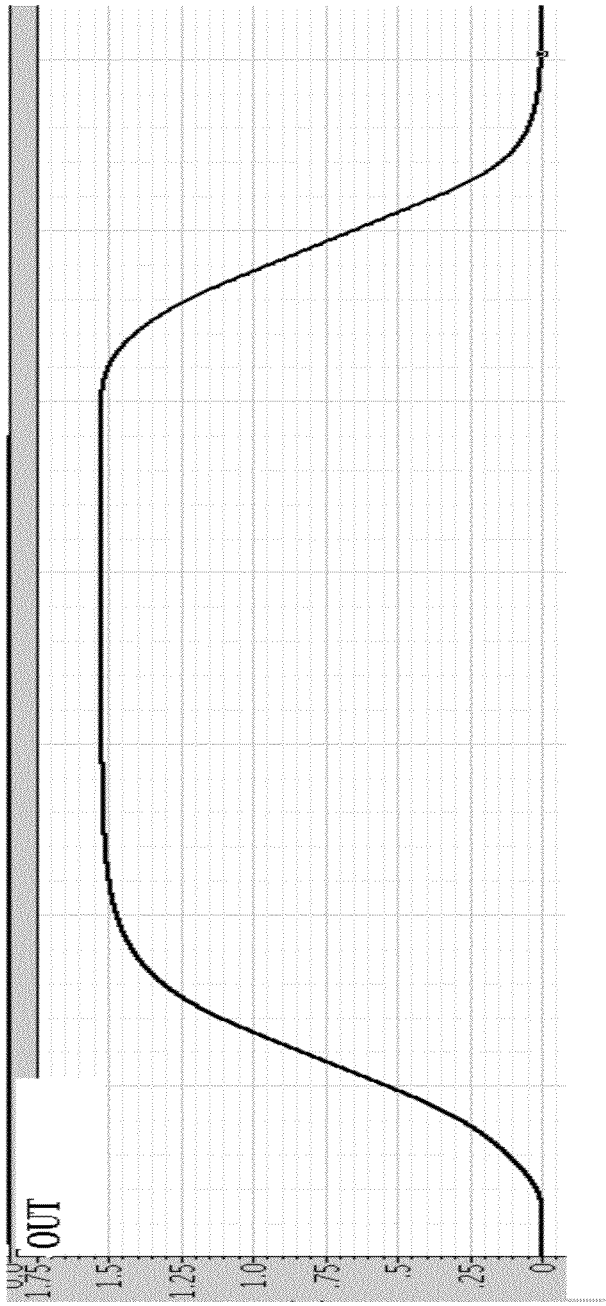
FIG. 5 is an oscillogram of a voltage of a blocking capacitor of the POP noise suppressing circuit according to the preferred embodiment of the present invention.

In order to suppress the POP noise, the voltage of the blocking capacitor CAC is supposed to increase slowly and smoothly in the process of powering on and to decrease slowly and smoothly in the process of powering off, which means indicating an S line and a counter-S line shown in FIG. 5.

In the POP noise suppressing circuit of the present invention, when the charging unit is working, the first voltage terminal C_DIS_F is at a low level and the ninth FET M9 is powered off; meanwhile, a voltage of the positive terminal VG of the first capacitor C1 is at a low level. The first capacitor C1 is charged by the referential current source $I_{VREF}$ so as to allow the voltage of the positive terminal VG of the first capacitor C1 to increase slowly and smoothly, in such a manner that a current I0 is formed between the fifth FET M5 and the eighth FET M8 and has a value of $(VG-V_{GS(M8)})/R1$. The current I0 increases slowly and smoothly because the voltage of the positive terminal VG increases slowly and smoothly. The seventh FET M7 mirrors the fifth FET M5 so a first current I1 increasing slowly and smoothly is produced; the sixth FET M6 also mirrors the fifth FET M5 so a second current I2 increasing slowly and smoothly is produced.

When the discharging unit is working, the first voltage terminal C_DIS_F is set at a high level and the ninth FET M9 releases the voltage of the first capacitor C1 to zero; then the first voltage terminal C_DIS_F is set at a low level and the ninth FET M9 is powered off, meanwhile the referential current source $I_{V_{REF}}$ starts to charge the first capacitor C1 to correspondingly produce a first current I1 and a second current I2 which increase slowly and smoothly.

It is necessary to adjust the POP noise suppressing circuit into a mute mode in the processes of powering on and powering off, which means that the mute controlling terminal MUTE is at a high level, when the power amplifier HP is in a unity gain structure.

Figure 4:
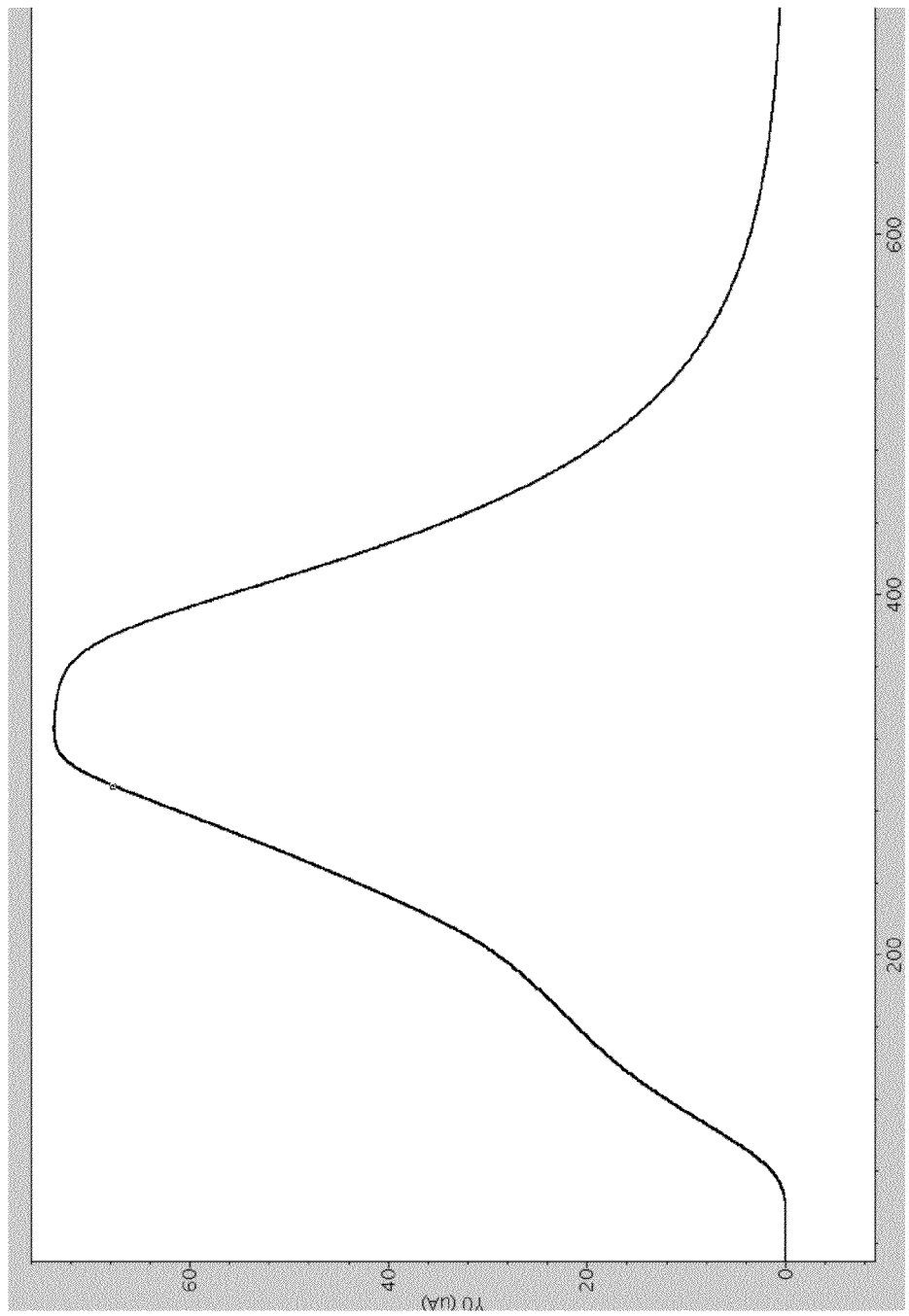
FIG. 4 is an oscillogram of a charging current and a discharging current of the POP noise suppressing circuit according to the preferred embodiment of the present invention.

In the process of powering on, the second voltage terminal UP is at a high level; the first FET M1 is powered off; the third voltage terminal DOWN is at a low level; the second FET M2 is powered off. The charging unit starts to work and the discharging unit is cut off. Herein the operational amplifier BUFFER is in a unity gain structure and the first current I1 inputted into the charging unit increases slowly and smoothly. The non-inverting inputting terminal IP of the operational amplifier BUFFER inputs a common mode voltage; the positive terminal of the filtering capacitor CVCM is inputted into the inverting inputting terminal IN and the voltage of the filtering capacitor CVCM has been zero before the process of powering on. Thus herein the operational amplifier BUFFER is open-circuit; I3=I1, I4=0, so the charging current ICH=I3−I4=I1, which means firstly the ICH increases slowly and smoothly; as the voltage of the filtering capacitor CVCM gradually gets close to the common mode voltage inputted by the referential voltage terminal $V_{REF}$ and the 14 is gradually formed, the ICH begins to decrease slowly and smoothly. As a result, as shown in FIG. 4, the charging current which firstly increases slowly and smoothly and then decreases slowly and smoothly is formed. The power amplifier HP has the unity gain structure, which means the outputting changes with the changing inputting, so the voltage of the blocking capacitor CAC increases in a direction proportion to the voltage of the non-inverting inputting terminal of the power amplifier HP. Furthermore, the voltage of the non-inverting inputting terminal of the power amplifier HP changes slowly with the changing charging current, so the voltage of the blocking capacitor CAC exhibits an increasing S line in the process of powering on.

In the process of powering off, the second voltage terminal UP is at a low level; the first FET M1 is powered off; the third voltage terminal DOWN is at a high level; the second FET M2 is powered off. Thus the charging unit is cut off and the discharging unit starts to work. Herein the voltage of the gate electrode of the second FET M2 is at a high level and the eleventh FET M11 mirrors the second current I2 which increases slowly and smoothly. Moreover, the voltage of the drain electrode of the eleventh FET M11 is at a common mode voltage and causes a saturation region. Thus the discharging current IDIS equals the second current I2. As the voltage of the filtering capacitor CVCM is gradually released, the voltage between the drain electrode and the source electrode of the eleventh FET M11 is also gradually reduced, which results in that the discharging current IDIS gradually decreases. Thus, as shown in FIG. 4, the discharging current which firstly increases slowly and smoothly and then decreases slowly and smoothly is formed. The power amplifier HP has the unity gain structure, which means the outputting changes with the changing inputting, so the voltage of the blocking capacitor CAC changes in a direction proportion to the voltage of the non-inverting inputting terminal of the power amplifier HP. Moreover, the voltage of the non-inverting inputting terminal of the power amplifier HP changes slowly with the changing charging current, thus the voltage of the blocking capacitor CAC exhibits a decreasing counter-S line in the process of powering off.

Figure 6:
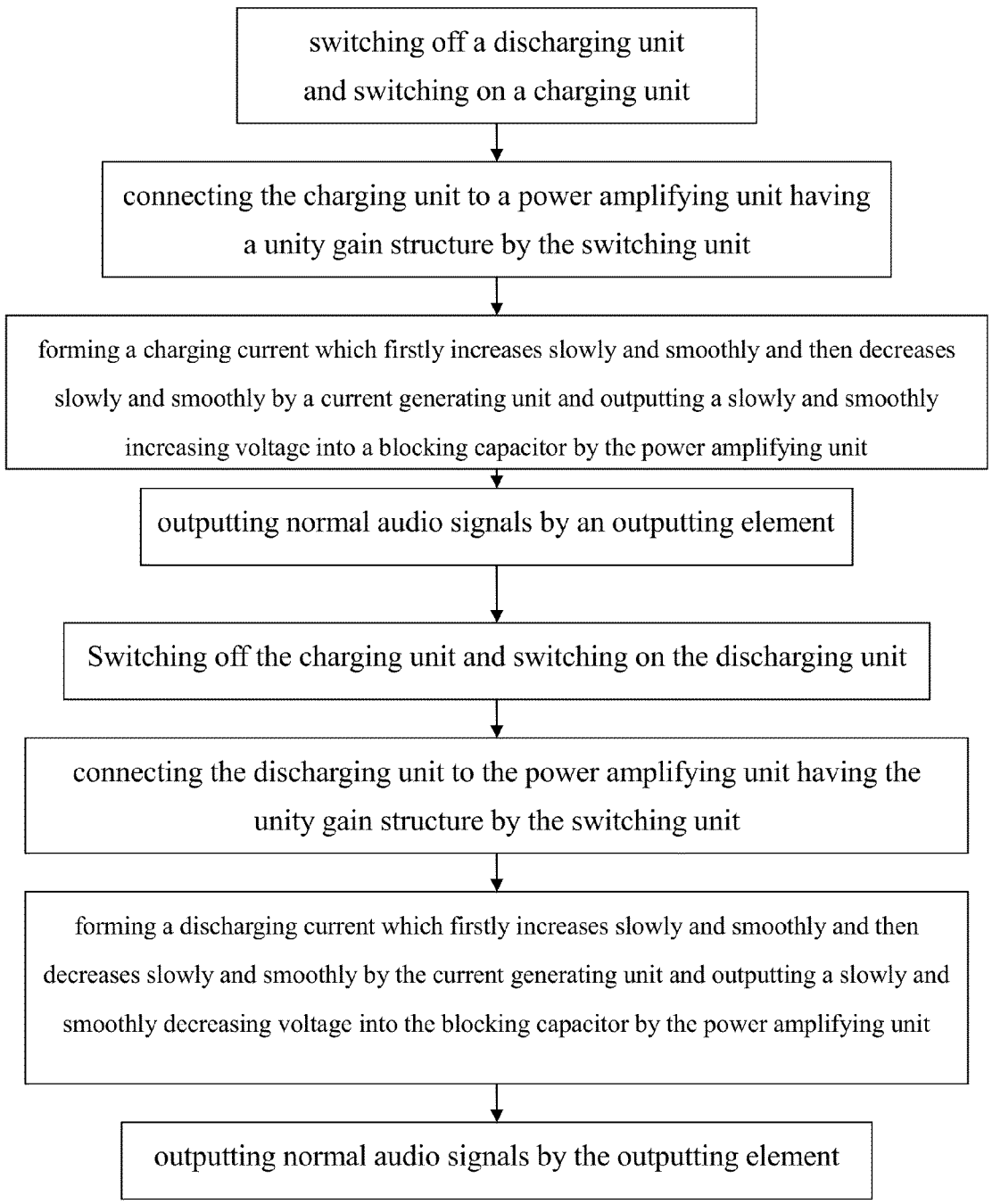
FIG. 6 is a flow chart of a POP noise suppressing method according to the preferred embodiment of the present invention.

Referring to FIG. 6, according to the preferred embodiment of the present invention, the POP noise suppressing method comprises following steps:

Step 1: in a process of powering on, switching off a discharging unit and switching on a charging unit by a switching unit;

Step 2: connecting the charging unit to a power amplifying unit having a unity gain structure by the switching unit to allow an inputting voltage of the power amplifying unit to increase slowly and smoothly with changes of a charging current ICH;

Step 3: generating a first current I1 which increases slowly and smoothly by a current generating unit, sending the first current I1 to the charging unit, charging a filtering capacitor CVCM and generating the charging current ICH which firstly increases slowly and smoothly and then decreases slowly and smoothly according to the first current I1 by the charging unit, and outputting a slowly and smoothly increasing voltage by the power amplifying unit to a blocking capacitor CAC;

Step 4: allowing a voltage of the blocking capacitor CAC to increase slowly and smoothly and thus outputting normal audio signals by an outputting element;

Step 5: switching off the charging unit and switching on the discharging unit by the switching unit in a process of powering off;

Step 6: connecting the discharging unit to the power amplifying unit having the unity gain structure by the switching unit to allow the inputting voltage of the power amplifying unit to decrease slowly and smoothly with changes of a discharging current IDIS;

Step 7: generating a second current I2 which increases slowly and smoothly by the current generating unit, sending the second current I2 to the discharging unit, charging the filtering capacitor CVCM, generating the discharging current IDIS which firstly increases slowly and smoothly and then decreases slowly and smoothly according to the second current I2 by the discharging unit, and outputting a slowly and smoothly decreasing voltage to the blocking capacitor CAC by the power amplifying unit; and Step 8: allowing the voltage of the blocking capacitor CAC to decrease slowly and smoothly and thus outputting normal audio signals by the outputting element.

In the above steps, the Step 1, 2, 3 and 4 are executed in the process of powering on; the Step 5, 6, 7 and 8 are executed in the process of powering off. The steps executed in the process of powering on and the steps executed in the process of powering off can be mutually exchanged according to practical needs.

The present invention allows the voltage of the blocking capacitor CAC to increase slowly and smoothly in the process of powering on and to decrease slowly and smoothly in the process of powering off. Moreover, the present invention has a simple structure and is able to effectively suppress POP noise of an audio system formed in the processes of powering on and powering off.

What is claimed is:

1. A POP noise suppressing circuit, for an audio system, comprising a blocking capacitor and an outputting element connected to said blocking capacitor, a current generating unit, a charging unit connected to said current generating unit, a discharging unit connected to said current generating unit, a switching unit connected to said charging unit and said discharging unit and a power amplifying unit connected between said switching unit and said blocking capacitor, wherein said current generating unit provides two slowly increasing currents respectively to said charging unit and said discharging unit; said switching unit is for switching between said charging unit and said discharging unit; a charging current which firstly increases slowly and smoothly and then decreases slowly and smoothly is formed in said charging unit; a discharging current which increases slowly and smoothly and then decreases slowly and smoothly is formed in said discharging unit; a voltage of said blocking capacitor increases smoothly when the audio system is powered on and decreases smoothly when the audio system is powered off; and wherein said current generating unit comprises a third field-effect transistor (FET), a fourth FET, a fifth FET, a sixth FET, a seventh FET, an eighth FET, a ninth FET, a referential current source, a first resistance and a first capacitor, wherein a first terminal of said referential current source is connected to a gate electrode and a source electrode of said third FET and a gate electrode of said fourth FET; a second terminal of said referential current source is connected to earth; a source electrode of said fourth FET is connected to a drain electrode of said ninth FET, a gate electrode of said eighth FET and a positive terminal of said first capacitor; a drain electrode of said eighth FET, a gate electrode and a source electrode of said fifth FET, a gate electrode of said sixth FET and a gate electrode of said seventh FET are all connected with each other.

2. The POP noise suppressing circuit, as recited in claim 1, wherein a first terminal of said first resistance is connected to a source electrode of said eighth FET; a first voltage terminal is connected to a gate electrode of said ninth FET; a source electrode of said ninth FET, a negative terminal of said first capacitor and a second terminal of said first resistance are all connected to earth; a source terminal is connected to a drain electrode of said third FET, a drain electrode of said fourth FET, a drain electrode of said fifth FET, a drain electrode of said sixth FET and a drain electrode of said seventh FET.

3. The POP noise suppressing circuit, as recited in claim 1, wherein said charging unit comprises an operational amplifier and a filtering capacitor; a source electrode of said seventh FET and a source controlling terminal of said operational amplifier are connected with each other; a non-inverting inputting terminal of said operational amplifier and a referential voltage terminal are connected with each other; an inverting inputting terminal of said operational amplifier and an outputting terminal of said operational amplifier are connected with each other.

4. The POP noise suppressing circuit, as recited in claim 2, wherein said charging unit comprises an operational amplifier and a filtering capacitor; a source electrode of said seventh FET and a source controlling terminal of said operational amplifier are connected with each other; a non-inverting inputting terminal of said operational amplifier and a referential voltage terminal are connected with each other; an inverting inputting terminal of said operational amplifier and an outputting terminal of said operational amplifier are connected with each other.

5. The POP noise suppressing circuit, as recited in claim 3, said switching unit comprises a first FET and a second FET; said discharging unit comprises a tenth FET and an eleventh FET; a source electrode of said sixth FET is connected to a gate electrode and a drain electrode of said tenth FET; said outputting terminal of said operational amplifier is connected to a source electrode of said first FET; a second voltage terminal is connected to a gate electrode of said first FET.

6. The POP noise suppressing circuit, as recited in claim 4, said switching unit comprises a first FET and a second FET; said discharging unit comprises a tenth FET and an eleventh FET; a source electrode of said sixth FET is connected to a gate electrode and a drain electrode of said tenth FET; said outputting terminal of said operational amplifier is connected to a source electrode of said first FET; a second voltage terminal is connected to a gate electrode of said first FET.

7. The POP noise suppressing circuit, as recited in claim 5, wherein a source electrode of said tenth FET, a source electrode of said eleventh FET and a negative terminal of said filtering capacitor are all connected to earth; a third voltage terminal is connected to a gate electrode of said second FET; a source electrode of said second FET is connected to a drain electrode of said eleventh FET.

8. The POP noise suppressing circuit, as recited in claim 6, wherein a source electrode of said tenth FET, a source electrode of said eleventh FET and a negative terminal of said filtering capacitor are all connected to earth; a third voltage terminal is connected to a gate electrode of said second FET; a source electrode of said second FET is connected to a drain electrode of said eleventh FET.

9. The POP noise suppressing circuit, as recited in claim 7, wherein said power amplifying unit comprises a power amplifier, a second resistance, a third resistance and a twelfth FET; a drain electrode of said first FET, a drain electrode of said second FET, a non-inverting inputting terminal of said power amplifier and a positive terminal of said filtering capacitor are all connected with each other; an audio inputting terminal is connected to a first terminal of said second resistance; a mute controlling terminal is connected to a gate electrode of said twelfth FET; a source electrode of said twelfth FET, a first terminal of said third resistance and a second terminal of said second resistance are all connected to an inverting inputting terminal of said power amplifier; a drain electrode of said twelfth FET, a second terminal of said third resistance and an outputting terminal of said power amplifier are all connected to a first terminal of said blocking capacitor; a second terminal of said blocking capacitor is connected to said outputting element.

10. The POP noise suppressing circuit, as recited in claim 8, wherein said power amplifying unit comprises a power amplifier, a second resistance, a third resistance and a twelfth FET; a drain electrode of said first FET, a drain electrode of said second FET, a non-inverting inputting terminal of said power amplifier and a positive terminal of said filtering capacitor are all connected with each other; an audio inputting terminal is connected to a first terminal of said second resistance; a mute controlling terminal is connected to a gate electrode of said twelfth FET; a source electrode of said twelfth FET, a first terminal of said third resistance and a second terminal of said second resistance are all connected to an inverting inputting terminal of said power amplifier; a drain electrode of said twelfth FET, a second terminal of said third resistance and an outputting terminal of said power amplifier are all connected to a first terminal of said blocking capacitor; a second terminal of said blocking capacitor is connected to said outputting element.

* * * * *